United States Patent

Fannash et al.

[11] Patent Number: 6,049,055
[45] Date of Patent: Apr. 11, 2000

[54] METHOD OF PRODUCING A SMART CARD

[75] Inventors: Lothar Fannash, Münster; Uwe Trüggelmann, Paderborn, both of Germany

[73] Assignee: Orga Kartensysteme GmbH, Paderborn, Germany

[21] Appl. No.: 08/952,318

[22] PCT Filed: Feb. 21, 1997

[86] PCT No.: PCT/DE97/00318

§ 371 Date: Nov. 26, 1997

§ 102(e) Date: Nov. 26, 1997

[87] PCT Pub. No.: WO97/31323

PCT Pub. Date: Aug. 28, 1997

[30] Foreign Application Priority Data

Feb. 23, 1996 [DE] Germany .................. 196 06 782

[51] Int. Cl.⁷ .................................................. B23K 26/00
[52] U.S. Cl. ................................ 219/121.66; 219/121.85
[58] Field of Search .......................... 219/121.64, 121.66, 219/121.69, 121.85, 121.61; 148/525; 427/556, 597

[56] References Cited

U.S. PATENT DOCUMENTS

| | | | |
|---|---|---|---|
| 4,477,819 | 10/1984 | Lee et al. | 347/264 |
| 4,564,739 | 1/1986 | Mattelin . | |
| 4,849,615 | 7/1989 | Mollet | 235/380 |
| 5,198,843 | 3/1993 | Ito et al. | 347/256 |
| 5,552,574 | 9/1996 | Merlin et al. | 219/121.69 |

FOREIGN PATENT DOCUMENTS

| | | |
|---|---|---|
| 0 463 930 | 6/1991 | European Pat. Off. . |
| 0653791 | 5/1995 | European Pat. Off. . |
| 61-166050 | 7/1986 | Japan . |
| 97/31323 | 8/1997 | WIPO . |

OTHER PUBLICATIONS

International Search Report for PCT/DE97/00318 dated Aug. 4, 1997.

*Primary Examiner*—Gregory Mills
*Attorney, Agent, or Firm*—Cohen, Pontani, Lieberman & Pavane

[57] ABSTRACT

The invention is a method of producing a chip module for use with a smart card. The chip module is mounted in the smart card and has contacts for communicating with external appliances. The contacts of the chip module include at least two layers which are acted upon by a laser beam to fuse the at least two layers forming an alloy. The alloy forms a pattern of visible information on the contacts.

26 Claims, 8 Drawing Sheets

METHOD OF PRODUCING A SMART CARD

FILED OF THE INVENTION

The invention relates to a method for producing smart cards having contacts with visible information on the contacts.

BACKGROUND OF THE INVENTION

Smart cards contain a chip module, which is a carrier element for a chip/IC module, having electrically conductive contacts. These contacts are conductively connected to corresponding connection points of the chip, thus enabling the smart card to communicate with appropriate appliances (smart card terminals). The chip module is fixed in a cutout in the smart card body which is open towards the front side of the card. Such smart cards have already become very widespread in the form of phone cards, health insurance cards, GSM cards, bank cards and credit cards, The layout of the surfaces of these smart cards (front side of the card and rear side) is configured in a complicated, mostly multicolored fashion; by contrast, at present only chip modules having a gold-colored or silver-colored surface of the contacts are available. In this case, these contacts are mostly constructed such that a metallic coating of nickel is applied as a diffusion barrier to a copper layer, and a gold, silver or palladium layer is applied thereon, the palladium metallic coating also appearing silver in color. So far, there have been very few possibilities for changing the optical appearance of the chip module surface.

A method for marking the metal contacts (applying visible information) of a smart card by laser engraving is described in EP 0 589 732. In this case, the gold layer is completely removed locally for the purpose of marking, the nickel layer situated therebelow, which is also partially removed as well, being visible. However, the associated damage to the gold layer impairs the protection of the metal contact surfaces against corrosion and oxidation.

SUMMARY OF THE INVENTION

It is the object of the invention to provide a method for producing a smart card having metal contacts, the aim being to apply visible information to the contacts without damaging the protection of the metal contacts against corrosion and oxidation.

Figure 4:
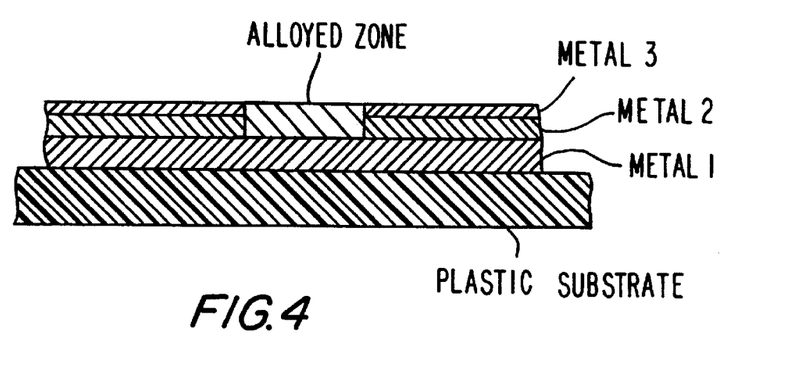
FIG. 4 is a sectional view of an embodiment of the chip module of the smart card of FIG. 1.

The contacts of a smart card (20, 20A)—compare FIG. 4—typically comprise a copper layer (metal 1) which clads a plastic substrate, a nickel layer (metal 2) which is applied to the copper layer and to which there is applied a gold, silver or palladium layer (metal 3). The layer thicknesses are not illustrated true to scale. The copper layer typically has a thickness of approximately 70 µm, the nickel layer a thickness of approximately 1–5 µm, and the noble-metal layer located thereon a thickness of <2 µm.

Figure 5:
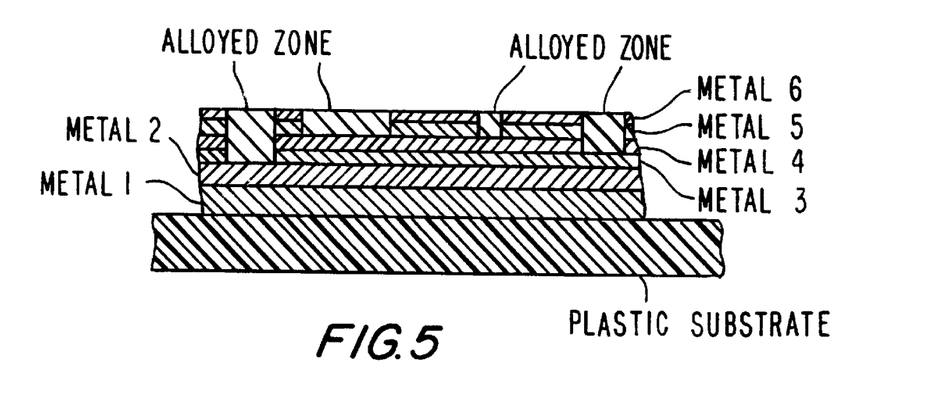
FIG. 5 is a sectional view of another embodiment of the chip module of the smart card of FIG. 1.

A wide pallet of possibilities for inscriptions of different colors is provided by further metal layers—compare FIG. 5—and an appropriate selection of the metals with regard to the reflective and absorptive properties of the pure metals as well as of the alloys between these metals.

The following layered structures are named by way of example:
Cu/Ni/Pd/Au
Cu/Ni/Pd
Cu/noble metal
Bronze/noble metal.

These layers can be applied to a substrate electrically, by vapor deposition or by sputtering.

Figure 2:
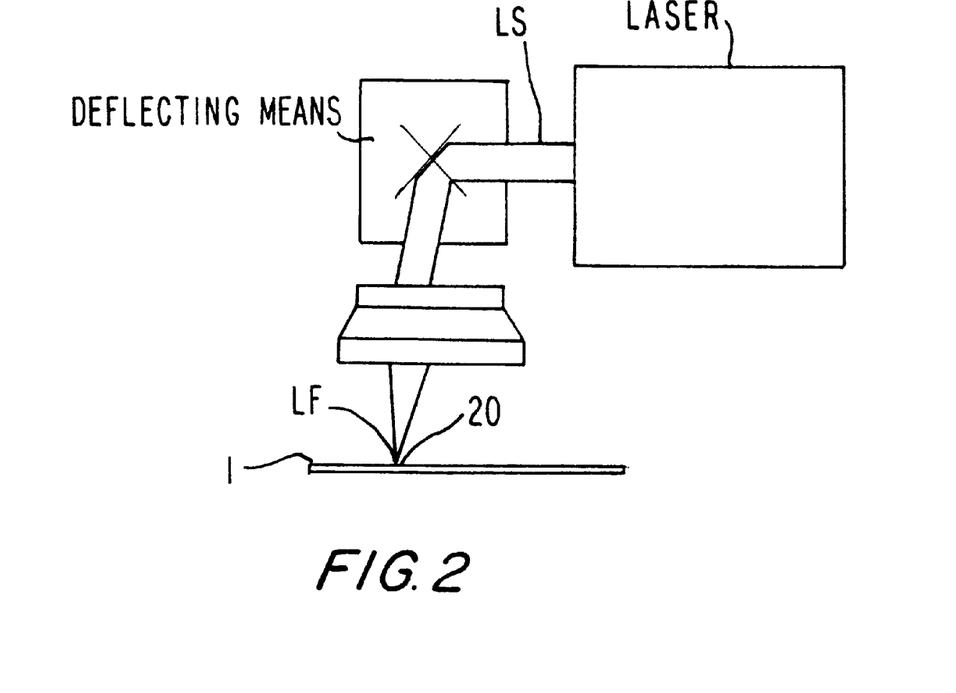
FIG. 2 shows a diagrammatic view of a laser system for applying a laser beam to the contacts of the chip module of FIG. 1.

In the first embodiment of the method, the laser beam (LS) is applied to the contacts (20, 20A) in such a way that the laser beam (LS) is guided over the contacts (20, 20A) using the raster or vector method. The laser system designed for this purpose is shown in FIG. 2, and has a deflecting unit for the laser beam (LS) which can be driven electronically. Such systems are already in use in so-called card personalization, where a laser is used to apply a number, for example, to the plastic body of the card. The laser used for this purpose is typically a neodymium YAG laser. The method according to the invention can thus be integrated in a simple way into the existing process of personalization. The most varied types of information (logos, alphanumeric characters, lines, guilloches) can be represented visibly on the contacts (20, 20A). Carrying out the inscription of the contact surfaces according to the invention by means of such a system can be done very flexibly without reequipping; for example, application of a serial number, application of different logos for various batches of smart cards in production. The intensity of the laser beam (LS), the speed with which the latter is guided over the contacts, and the size of a laser spot (LF) on the contacts, which effect the local dwell time and the local radiative energy input, can be set in a simple way in this process in order to achieve an optimum result of inscription in each case.

DETAILED DESCRIPTION OF THE PREFERRED EMBODIMENTS

Figure 1:
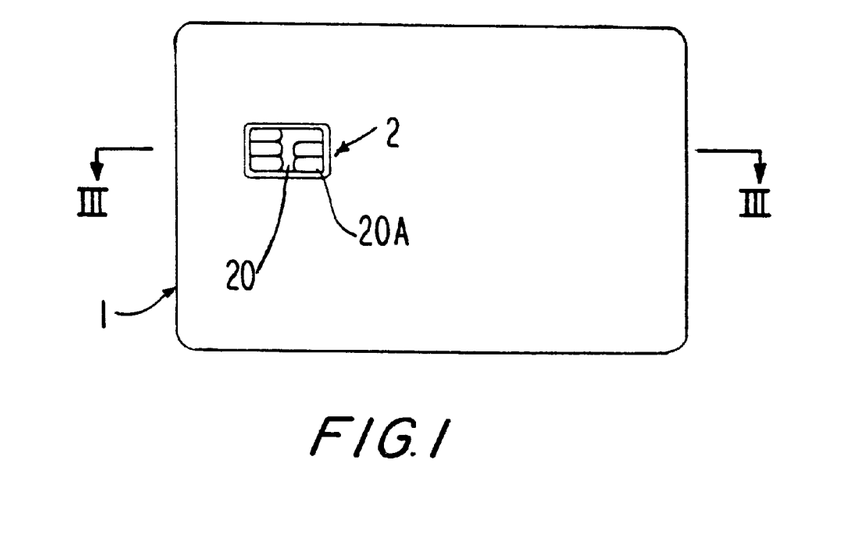
FIG. 1 shows a top view of a smart card with a chip module having contacts.

A smart card (1) having contacts is represented in FIG. 1. Located in the smart card (1) is a chip module (2) fixed in a cutout which is open towards the front side of the card. The invention specifies a method for configuring the metal contacts (20A), which form the surface (20) of the chip module (2). Visible information can be produced on the contacts (20, 20A) using this method. For this purpose, laser beam (LS) is applied to the contacts (20, 20A), which comprise at least two metal layers arranged one above the other,—see FIG. 2. In this case, two or more layers are fused locally in each case (corresponding to the information to be represented) under the influence of the laser beam (LS) to form an alloy. The alloyed zone differs in its color, that is to say in its reflection and absorption spectra, from the surrounding region of the contact.

Figure 3:
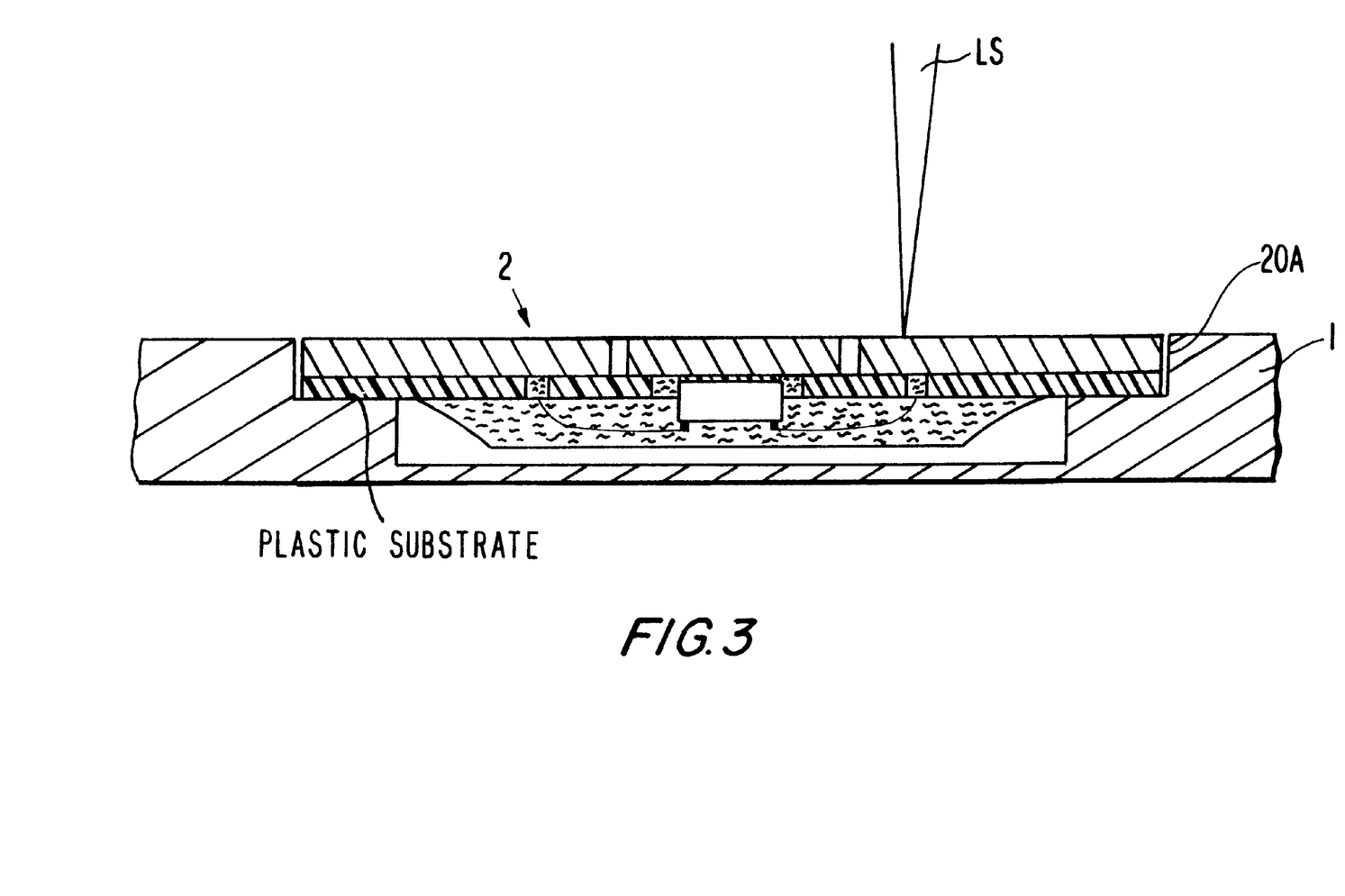
FIG. 3 is a sectional view through line III—III of the smart card of FIG. 1.

For the purpose of better understanding, a section through the smart card (1) in the region of the chip module (2) having the contacts (20, 20A) is represented in FIG. 3. Different layered structures of the contacts (20, 20A) are represented in FIGS. 4 and 5.

In order for the laser radiation not to damage the plastic substrate exposed in the insulating, metal-free interspaces between the contacts, during guidance of the laser beam (LS) over two or more contacts (20, 20A) and beyond, the laser beam is switched off, swivelled, dimmed or attenuated on its path over the insulating interspaces.

In a second embodiment of the method the laser radiation is applied to the contacts (20, 20A) using the method of mask technology (not represented). In this case, a mask designed in accordance with information to be applied is arranged in the beam path of the laser radiation. This method is particularly advantageous in the case of large batch numbers when identical information (a mask, a mask set) is to be repeatedly applied. In this case, the mask is advantageously designed in such a way that it shades the laser radiation at the insulating interspaces. The intensity and the irradiation period are in this case tuned to the metals to be alloyed with one another and to the number of the layers to be fused.

The present invention provides, on the one hand, for inscribing smart cards already provided with contacts, both using the raster and vector methods and using the mask method. Moreover, the present invention also provides for inscribing the contacts (20, 20A) as early as on an intermediate product (not represented) for producing chip modules (2). The intermediate product includes the plastic substrate and the contacts and may include the chips to be conductively connected to the contacts. The intermediate product may also include a plurality of chip modules. It is the case here of so-called substrate strips to which the contacts (20, 20A) are applied to produce a multiplicity of chip modules.

Figure 6:
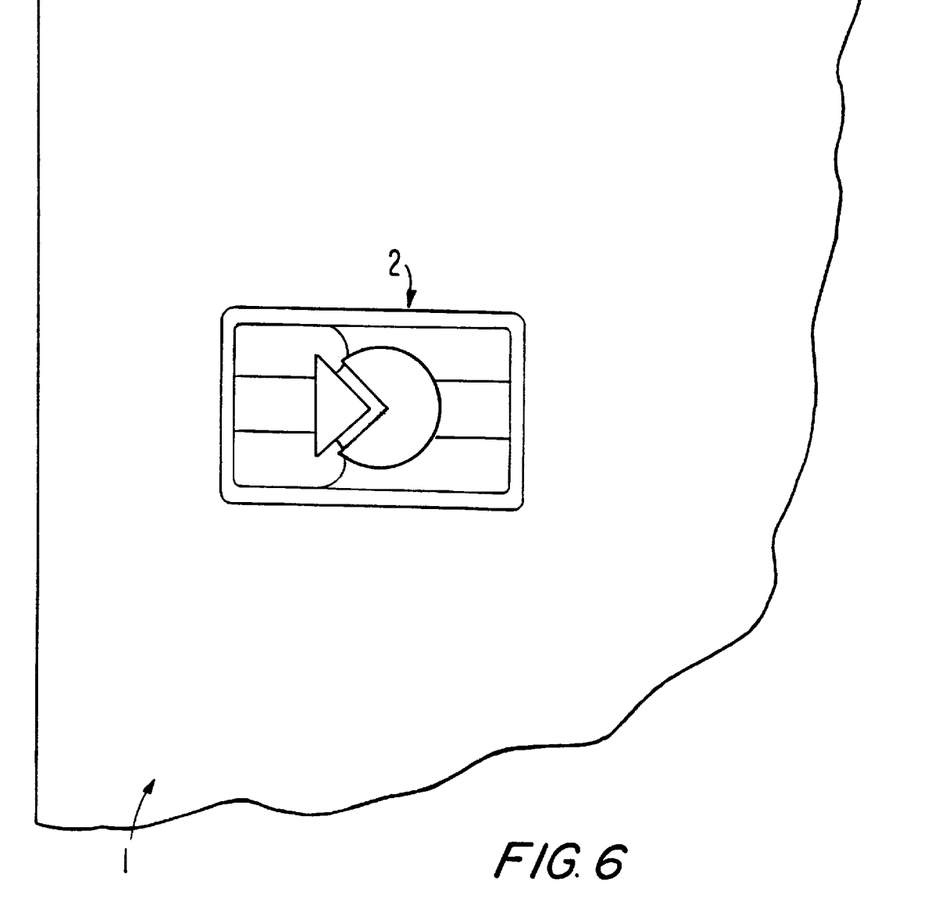
FIGS. 6–10 each show a portion of the top of the smart card of FIG. 1 with various types of visual elements applied to the contact surfaces of the chip module.
Figure 7:
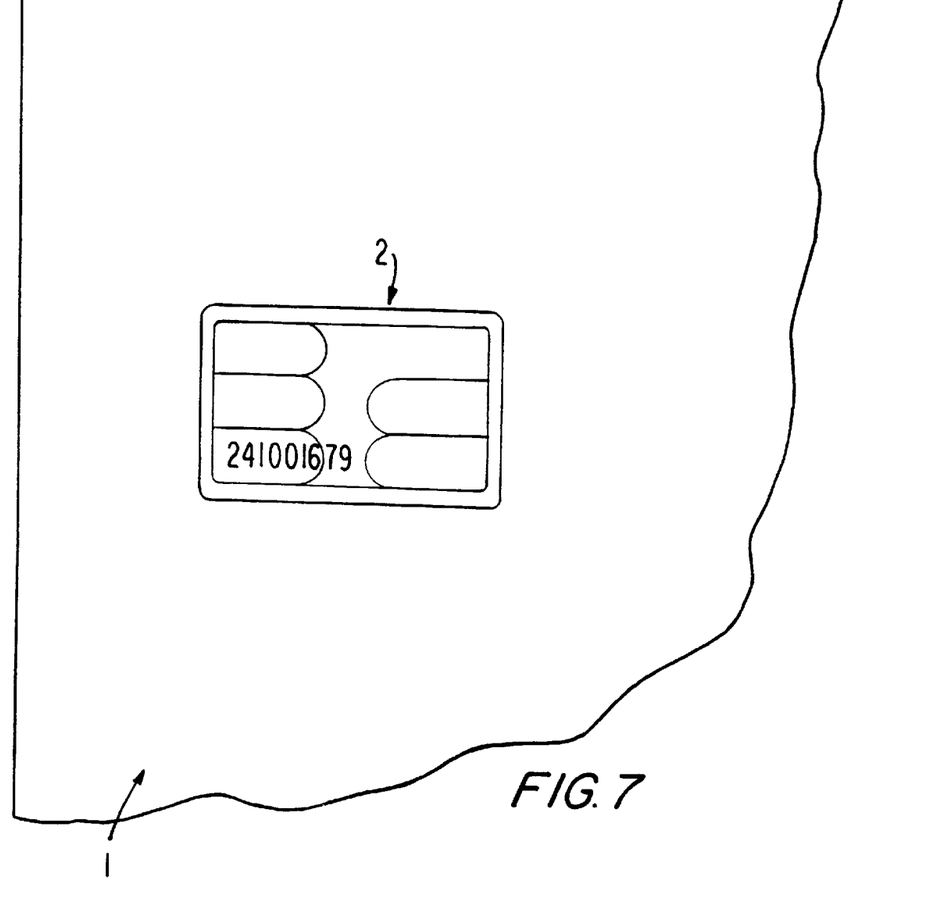
Figure 8:
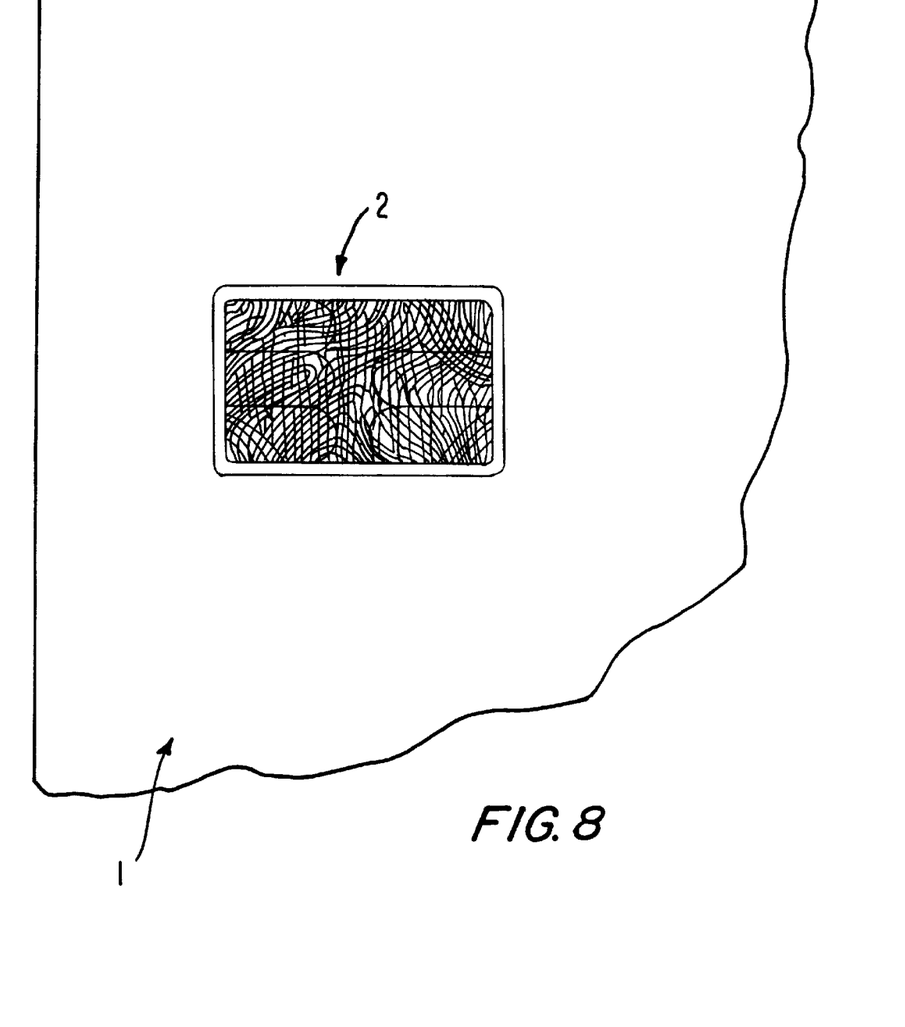
Figure 9:
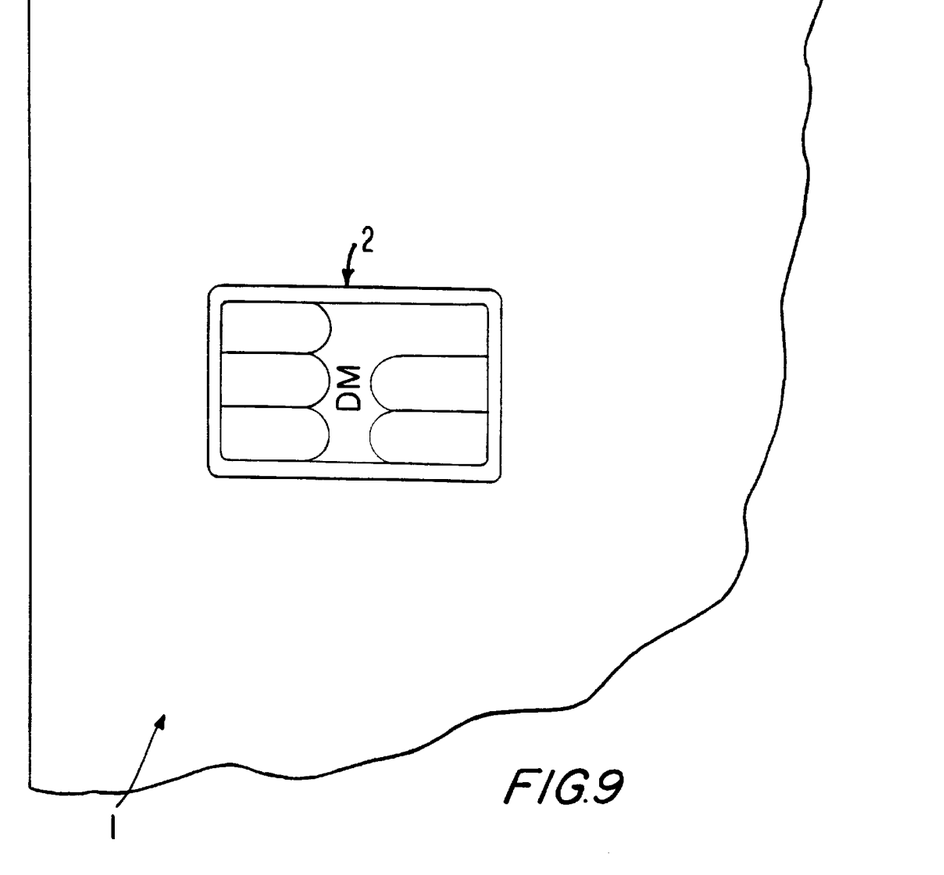
Figure 10:
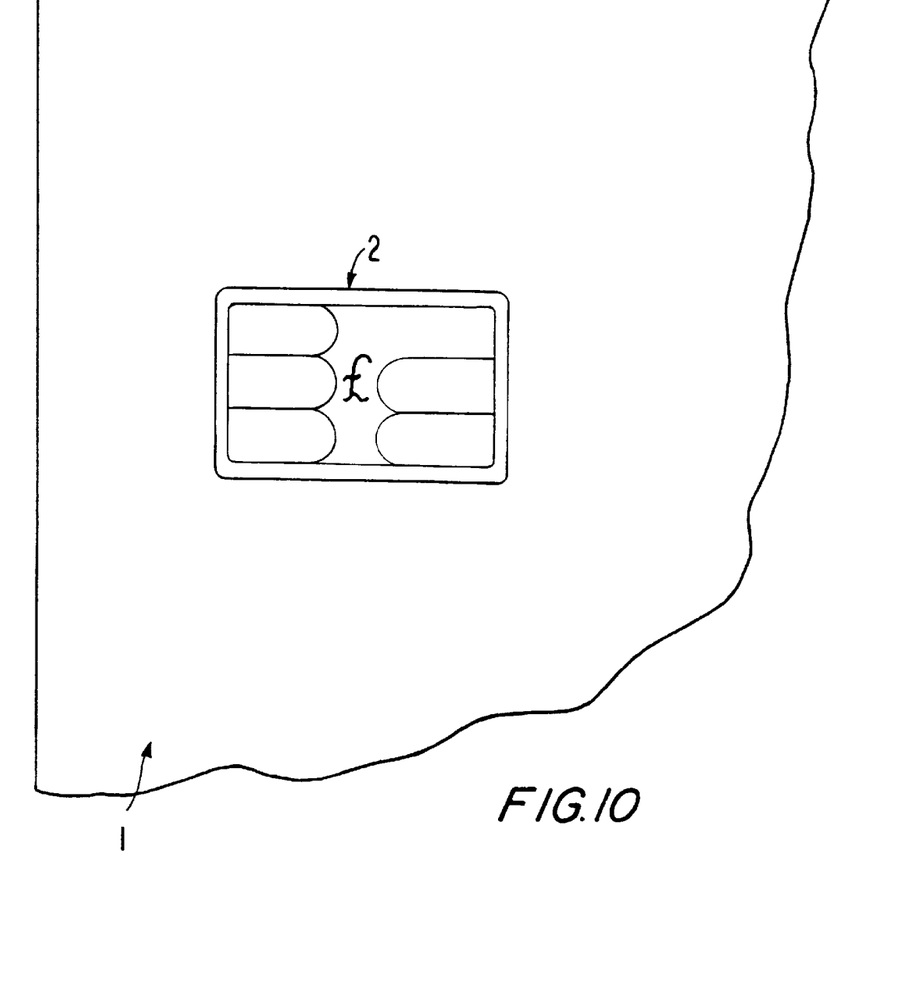

For illustrative purposes, a few of the possibilities of the method according to the invention are represented in FIGS. 6 to 10. FIG. 6 shows how a logo was applied by means of laser radiation on the contacts (20, 20A). FIG. 7 shows contacts (20, 20A) with a serial number applied. FIG. 8 shows an applied guilloche pattern, FIGS. 9 and 10 show applied currency symbols.

It becomes clear from this that such inscription on the contacts (20, 20A) also serves as a security feature.

What is claimed is:

1. A method for producing a chip module for a smart card having contacts for communication with external appliances, comprising the steps of:

forming the chip module by applying at least first and second metal layers on a substrate;

applying a laser beam to the contacts for fusing two of the at least first and second metal layers wherein the fused two of the at least first and second form an alloy, the alloy forming a pattern of visual information on the contacts of the chip module, the pattern of visual information including at least one segment that extends continuously from a first contact to a second contact across an insulating, metal-free interspace therebetween; and minimizing the application of the laser beam to the insulating, metal-free interspace between the first contact and the second contact to prevent damage thereto when the laser beam is guided over the interspace between the first contact and the second contact while forming the at least one segment of the pattern that extends continuously from the first contact to the second contact.

2. The method of claim 1, wherein said step of applying a laser beam comprises guiding the laser beam over the contacts using one of a raster and a vector method.

3. The method of claim 2, wherein said step of guiding the laser beam comprises selecting a speed of the laser beam such that a local dwell time and a local radiative energy input associated therewith are effective for formation of the alloy.

4. The method of claim 1, wherein said step of applying a laser beam comprises selecting a speed at which said laser beam is guided over the contacts such that a local dwell time and a local radiative energy input associated therewith are effective for fusing at least three layers of the at least first and second metal layers for formation of the alloy.

5. The method of claim 1, wherein said step of applying a laser beam comprises varying at least one of a size and a shape of the laser beam while guiding the laser beam across the contacts.

6. The method of claim 1, wherein said step of minimizing the application of the laser beam to the insulating, metal-free interspace between the first and second contacts comprises one of switching off, swivelling, dimming, and attenuating the laser beam when the laser beam is guided over the interspace between the first and second contacts.

7. The method of claim 1, wherein said step of applying a laser beam further comprises applying the laser beam to the contacts through a mask designed in accordance with the visual information to be applied to the contacts.

8. The method of claim 7, wherein said step of minimizing the application of the laser beam to the insulating, metal-free interspace between the first and second contacts comprises at least partially blocking the laser beam from reaching the interspace between the first and second contacts with the mask.

9. The method of claim 7, wherein said step of applying the laser beam comprises selecting a speed of the laser beam such that a local dwell time of the laser beam on the contacts and a local radiative energy input associated therewith are effective for the formation of the alloy.

10. The method of claim 7, wherein said step of applying a laser beam comprises selecting a speed at which said laser beam is guided over said contacts such that a local dwell time and a local radiative energy input associated therewith are effective for fusing at least three layers of the at least first and second metal layers for the formation of the alloy.

11. The method of claim 1, wherein said step of applying a laser comprises using a neodymium YAG laser.

12. The method of claim 1, wherein said step of applying a laser comprises using a excimer laser.

13. The method of claim 1, wherein said step of applying a laser comprises using a $CO_2$ laser.

14. The method of claim 1, wherein said step of applying a laser comprises using a pulsed operation laser.

15. The method of claim 1, wherein said step of applying a laser comprises using a continuous mode laser.

16. The method of claim 1, further comprising the step of positioning a smart card with a chip module mounted therein in a laser inscription system before the step of applying a laser.

17. The method of claim 1, wherein the step of applying a laser beam comprises applying the laser beam to the contacts when the chip module is mounted on an intermediate product which comprises a plurality of chip modules for a plurality of smart cards.

18. The method of claim 1, wherein said step of forming the contacts comprises the step of forming a plurality of chip modules on an intermediate product, each of the chip modules containing contacts for receiving a chip and insertable in the smart card; and said step of forming an alloy comprises applying the laser to each of the plurality of chip modules.

19. The method of claim 1, wherein said step of forming the chip module includes forming a layered structure comprising a copper layer, a nickel layer, and at least one noble-metal layer.

20. The method of claim 1, wherein said step of forming the chip module includes forming a layered structure comprising a copper layer, a nickel layer, and gold layer.

21. The method of claim 1, wherein said step of forming the chip module includes forming a layered structure comprising a copper layer, a nickel layer, and silver layer.

22. The method of claim 1, wherein said step of forming the chip module includes forming a layered structure comprising a copper layer, a nickel layer, and palladium layer.

23. The method of claim 1, wherein said step of forming the chip module includes forming a layered structure comprising a copper layer, a nickel layer, a palladium layer, and a gold layer.

24. The method of claim 1, wherein said step of forming the chip module includes forming a layered structure comprising a copper layer and a noble-metal layer.

25. The method of claim 1, wherein said step of forming the chip module includes forming a layered structure comprising a bronze layer and a noble-metal layer.

26. A method for producing a chip module for a smart card having contacts for communication with external appliances, comprising the steps of:
    forming the chip module by applying at least first and second metal layers on a substrate;
    applying a laser beam to the contacts for fusing two of the at least first and second metal layers wherein the fused two of the at least first and second form an alloy, the alloy forming a pattern of visual information on the contacts of the chip module; and
    varying an intensity of the laser beam while guiding the laser beam over the contacts for forming different types of alloys from the at least first and second layers along the path of the laser beam.

* * * * *